(12) United States Patent
Boselli et al.

(10) Patent No.: US 8,306,804 B2
(45) Date of Patent: Nov. 6, 2012

(54) SYSTEM, AN APPARATUS AND A METHOD FOR PERFORMING CHIP-LEVEL ELECTROSTATIC DISCHARGE SIMULATIONS

(75) Inventors: Gianluca Boselli, Plano, TX (US); Jonathan S. Brodsky, Richardson, TX (US); John E. Kunz, Jr., Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 613 days.

(21) Appl. No.: 12/434,573

(22) Filed: May 1, 2009

(65) Prior Publication Data

US 2010/0169064 A1 Jul. 1, 2010

Related U.S. Application Data

(60) Provisional application No. 61/142,142, filed on Dec. 31, 2008.

(51) Int. Cl.
*G06F 17/50* (2006.01)
(52) U.S. Cl. ........................................................ 703/14
(58) Field of Classification Search .................. 703/14
See application file for complete search history.

(56) References Cited

U.S. PATENT DOCUMENTS 6,539,531 B2 * 3/2003 Miller et al. .................. 716/106

OTHER PUBLICATIONS

Xie et al. "A 3D Mixed-Mode ESD Protection Circuit Simulation-Design Methodology", 2004, IEEE Custom Integrated Cricuits Conferences, pp. 243-246.*
Brennan et al. "ESD design automation & methodology to prevent CDM failures in 130 & 90 nm ASIC design systems", 2006, Journal of Electrostatics, 64, pp. 112-127.*
Boselli, et al.; "An ESD Protection Validator, an ESD Validation System and a Method of Validating ESD Protection for an IC"; U.S. Appl. No. 12/434,581, filed May 1, 2009.

* cited by examiner

*Primary Examiner* — Suzanne Lo
(74) *Attorney, Agent, or Firm* — Warren L. Franz; Wade J. Brady, III; Frederick J. Telecky, Jr.

(57) ABSTRACT

A modeler for components of an IC under ESD conditions, a method of simulating ESD behavior of an IC and an ESD simulation system. In one embodiment, the modeler includes: (1) a circuit analyzer configured to provide identified ESD cells and circuitry of the IC by comparing component information of the IC with predefined ESD protection elements and predefined circuit topologies and (2) a model generator configured to create linearized models of the identified ESD cells and the identified circuitry based on physical attributes associated with the identified ESD cells and the identified circuitry, wherein a combination of the linearized models represent operation of the IC component under ESD conditions.

16 Claims, 3 Drawing Sheets

SYSTEM, AN APPARATUS AND A METHOD FOR PERFORMING CHIP-LEVEL ELECTROSTATIC DISCHARGE SIMULATIONS

CROSS-REFERENCE TO RELATED APPLICATION

This application claims the benefit of U.S. Provisional Application Ser. No. 61/142,142, filed by Gianluca Boselli, et al., on Dec. 31, 2008, entitled "METHOD TO PERFORM CHIP-LEVEL ELECTROSTATIC DISCHARGE SIMULATIONS," commonly assigned with this application and incorporated herein by reference. This application is also related to the following U.S. patent applications, which are commonly assigned herewith and incorporated herein by reference:

application Ser. No. 12/434,578, filed by Boselli, et al. on even date herewith and entitled, "A METHOD OF OPTIMIZING ESD PROTECTION FOR AN IC, AN ESD PROTECTION OPTIMIZER AND AN ESD PROTECTION OPTIMIZATION SYSTEM;" and application Ser. No. 12/506,597, filed by Boselli, et al. on even date herewith and entitled, "AN ESD PROTECTION VALIDATOR, AN ESD VALIDATION SYSTEM AND A METHOD OF VALIDATING ESD PROTECTION FOR AN IC."

TECHNICAL FIELD

This application is directed, in general, to protecting integrated circuits (ICs) from electrostatic discharges (ESD) and, more specifically, to simulating ESD protection for an IC.

BACKGROUND

ESD is the transfer of an electrostatic charge between two objects that can occur when two objects of different potentials come into direct contact with each other. In the semiconductor industry, the occurrence of an ESD event can be one of the leading causes for the failure of ICs. ESD protection for ICs is even growing in importance as the demand for higher operating speed, smaller operating voltages, higher packing density and reduced cost drives a reduction of device dimensions. Each of these factors can contribute to an increased sensitivity of ICs to damaging ESD events.

Semiconductor manufacturers may require a product to pass an ESD qualification before being released to customers to determine that ESD protection is provided and that the ESD protection complies with applicable requirements. To determine the existence and compliance of ESD protection, review teams may examine the schematic and layout of each IC. Typically, this examination process is manual and therefore can be tedious and time-consuming.

Simulations of ICs, such as a simulation generated using Simulation Program with Integrated Circuit Emphasis (SPICE), could be used instead of manual examination of the circuits. However, fully-physical ESD models for each specific circuit of an IC would be needed. These ESD models would result in more complex models than standard SPICE models and require very large scale simulation. Improved ESD simulations, therefore, for ICs would be useful in the art.

SUMMARY

One aspect provides a modeler for components of an IC under ESD conditions. In one embodiment, the modeler includes: (1) a circuit analyzer configured to provide identified ESD cells and circuitry of the IC by comparing component information of the IC with predefined ESD protection elements and predefined circuit topologies and (2) a model generator configured to create linearized models of the identified ESD cells and the identified circuitry based on physical attributes associated with the identified ESD cells and the identified circuitry, wherein a combination of the linearized models represent operation of the IC component under ESD conditions.

In another aspect, a method of simulating ESD behavior of an IC is disclosed. In one embodiment, the method includes: (1) identifying circuitry and ESD cells of the IC, (2) generating linear models of the identified circuitry and the identified ESD cells based on physical attributes associated therewith and (3) simulating the IC under ESD conditions employing the linear models.

In yet another aspect, an ESD simulation system is disclosed. In one embodiment, the ESD simulation system includes: (1) a predefined ESD protection element database configured to store technology-independent topologies of ESD protection elements wherein each of the topologies has a defined set of attributes for each pair of terminals thereof, (2) an ESD protection element attributes database configured to store technology-dependent protection cell physical attributes associated with the ESD protection elements, (3) a predefined circuit database configured to store topologies of circuitry wherein each of the topologies has a defined set of attributes for each pair of terminals thereof, (4) a circuit attributes database configured to store circuitry physical attributes associated with the circuitry topologies and (5) an ESD modeler. The ESD modeler includes: (5A) a circuit analyzer configured to provide identified ESD cells and circuitry of the IC by comparing component information of the IC with the predefined ESD protection elements and the predefined circuit topologies and (5B) a model generator configured to create linearized models of the identified ESD cells and the identified circuitry based on the protection cell physical attributes associated with the identified ESD cells and the circuitry physical attributes associated with the identified circuitry, wherein a combination of the linearized models represent operation of the identified ESD cells and the circuitry under ESD conditions.

BRIEF DESCRIPTION

Reference is now made to the following descriptions taken in conjunction with the accompanying drawings, in which.

DETAILED DESCRIPTION

The disclosure relates to performing ESD simulations at a chip-level (i.e., an IC-level). Physical attributes of ESD cells (i.e., ESD protection cells) and IC circuitry are employed to create ESD models of the ESD cells and IC circuitry. The physical attributes associated with the circuitry and the ESD cells can be retrieved from respective databases for the modeling. The physical attributes associated with the IC circuitry and the ESD cells are for ESD conditions according to known protection requirements. The known requirements can be design and pin requirements for a desired IC. The requirements may vary per design and for the pins. The requirements can include voltage, power, load, etc. The known requirements can also include ESD protection requirements for a particular design or manufacturing node. The ESD protection requirements may be based on known manufacturing or industry standards.

Figure 1:
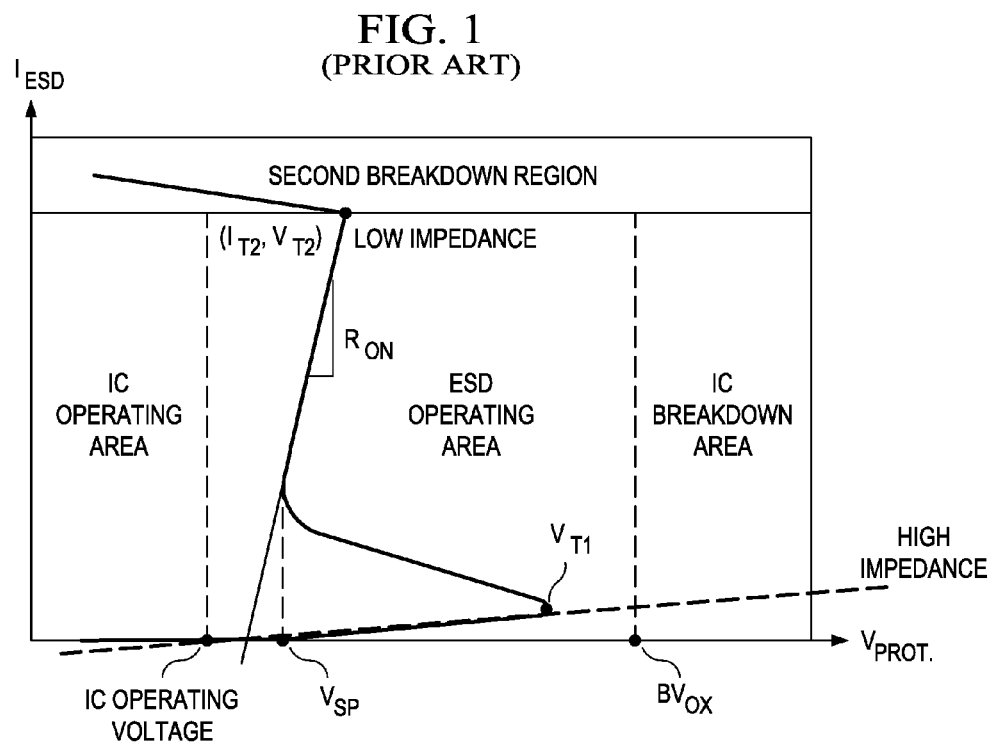
FIG. 1 illustrates a graph representing the operation of a component (i.e., an ESD cell or IC circuitry) of an IC with respect to ESD conditions.

Modeling the behavior of the ESD cells and the IC circuitry under ESD conditions is presented as the sum of two regimes denoted as high impedance and low impedance. For example, FIG. 1 illustrates a graph representing the operation of a component (i.e., an ESD cell or IC circuitry) of an IC with respect to ESD conditions. The graph includes four designated areas including an IC operating area, an IC breakdown area, a thermal breakdown area and a ESD operation area. The y-axis of the graph is the current and the x-axis is the voltage of the component. Various parameters of the component are noted on the graph in the ESD operation area including the nominal voltage, $V_{SP}$, $V_{T1}$, $BV_{OX}$, $R_{ON}$, $I_{T2}$ and $V_{T2}$. These parameters are typically used to represent the operation of components under ESD conditions (e.g., the high current behavior of ESD cells and IC circuitry). These parameters are defined as: $V_{SP}$—sustaining voltage of the parasitic element within the topology; $V_{T1}$—a first triggering voltage of a parasitic element within the component under specific bias conditions; $BV_{OX}$—oxide breakdown voltage; $R_{ON}$—the on-resistance of the parasitic element within the component; $I_{T2}$—the maximum sustaining current of the parasitic element within the component; and $V_{T2}$—a second triggering voltage of the parasitic element within the component.

Operation of a component in the ESD operating area can be represented by the high impedance model and the low impedance model indicated on the graph. The high impedance model and the low impedance model are linear models that can be defined by $V_{T1}$, and by $V_{SP}$, $R_{ON}$, $I_{T2}$ respectively. In other words, the identified high impedance and low impedance models of FIG. 1 provide a linear approximation of the function of the component in the ESD operating area at given points. Both the high impedance and the low impedance model represent a linear relationship that can be implemented into a conventional modeler, such as a tool using the Verilog-A language, to provide models that are suitable for large scale simulations. The Verilog-A models can then be used in a simulator to simulate the operation of the ESD cells and the circuitry of the IC at ESD conditions. An analog electronic circuit simulator, such as a Spice simulator, may be used for the simulations. Verilog-A is an analog modelling language from Cadence Design Systems of San Jose, Calif.

In addition to employing linearized models for simulations, the disclosure also includes intelligently pruning a network to be simulated. To intelligently prune the IC network, the high impedance model is used for each pin-pair of a component to determine the lowest impedance paths due to, for example, an ESD event.

Using the high impedance models, the total voltage drop of the ESD cells and the circuitry in all the paths between the pin-pairs is determined by the simulations. The paths can then be ordered for each pin-pair based on the total voltage drop of the paths. In one embodiment, the paths can be ranked in increasing order of voltage drop from the lowest voltage drop to the highest voltage drop. The path for each pin-pair having the lowest voltage drop can then be modeled and simulated using low-impedance linear models. As such, the high impedance models can be used to reduce the number of paths to be simulated using low impedance models. The voltage drop of the paths having the next lowest voltage drop to the paths with the lowest voltage drop may be used as a threshold voltage to determine if the paths being simulated employing the low impedance models have a lower voltage drop. If not, the paths with the next lowest voltage drop may be used to add to the original paths as determined based on the high impedance model simulations.

Figure 2:
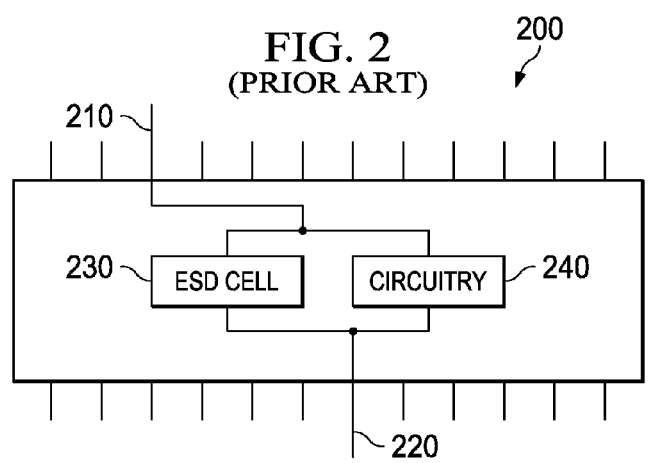
FIG. 2 is a block diagram of an IC having a plurality of pins.

The disclosure provides models for ESD cells and circuitry of ICs under ESD condition that can be used for ESD simulations. Component information for an IC design (i.e., the IC) may be obtained from a schematic and layout of the IC. The IC component information may include the elements, attributes and describe the connectivity of the IC. A netlist from the IC's schematic and layout may be used to provide the IC component information. The netlist can be used to identify ESD cells and circuitry of the IC. FIG. 2 provides an example of an IC that may be modeled and simulated according to the principles of this disclosure.

FIG. 2 is a block diagram of an IC 200 having a plurality of pins. The pins are conducting components that provide internal access to and external access for the IC 200. The pins may be referred to as external conductive extrusions. ESD cells are coupled to the plurality of pins to provide ESD protection for circuitry coupled to the pins. Pins 210 and 220 are denoted to represent the plurality of pins. Additionally, ESD cell 230 and circuitry 240 are illustrated to represent ESD protection and the circuitry that is protected from ESD events by the ESD cell 230.

For example, the ESD cell 230 may include suppression components that protect the circuitry 240 coupled between the pins 210, 220, from an ESD voltage. The suppression components may clamp the ESD voltage to an appropriate level that the circuitry 240 can survive. Connected in parallel with the circuitry 240, the ESD cell 230 can clamp the ESD voltage and shunt at least a majority of the ESD current away from the circuitry 240 to an appropriate dissipation reference.

Figure 3:
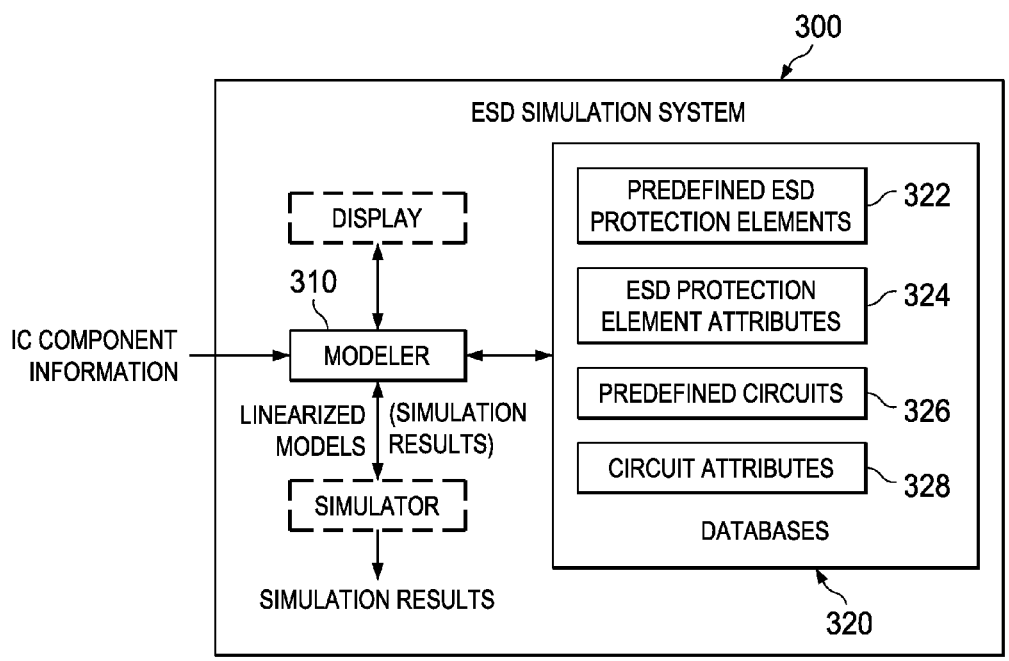
FIG. 3 is a block diagram of an embodiment of a ESD simulation system constructed according to the principles of the disclosure.

FIG. 3 is a block diagram of an embodiment of an ESD simulation system 300 constructed according to the principles of the disclosure. The ESD simulation system 300 includes a modeler 310 and databases 320. The databases 320 include a database for predefined ESD protection elements 322, ESD protection element attributes 324, predefined circuits 326 and circuit attributes 328. Each database of the databases 320 may be a conventional database.

The modeler 310 is configured to generate linearized models for components of an IC. The modeler 310 or at least a portion thereof may be embodied as a series of operating instructions stored on a computer readable storage medium that directs the operation of a processor when executed thereby. In one embodiment the modeler 310 may be a dedicated computing-device having the necessary circuitry to perform the functions described herein. The modeler 310 may employ the Verilog-A language to generate linear models to represent the ESD cells and circuitry of the IC. In other embodiments, other analog modeling languages may be used. An embodiment of a modeler is discussed in more detail with respect to FIG. 4.

The modeler 310 provides the generated linearized models to a simulator to simulate ESD protection for the IC. The simulator may be a conventional analog simulator, such as a SPICE simulator. The simulator may be part of the ESD simulation system 300 or may be an independent simulator that is coupled to the ESD simulation system 300. Results of the simulation are provided by the simulator. In one embodiment, the ESD simulation system 300 may include a display that is used to visually provide the simulation results.

The predefined ESD protection element database 322 is configured to store technology-independent topologies of ESD protection elements. The topologies represent the physical and logical structure of ESD protection elements. The topologies may represent the ESD protection elements as n-terminal "black boxes" having any m components connected between the n terminals in any given fashion. For example, a topology may have two, three, four or more terminals. The terminals may be reference terminals, power terminals, input terminal, etc. Each of the topologies of the ESD protection elements has a defined set of attributes for each pair of terminals of the topologies. The stored topologies, therefore, represent known ESD protection elements.

The ESD protection element attributes database 324 is configured to store technology-dependent physical attributes associated with the ESD protection elements. The technology-dependent attributes includes attributes that are terminal-independent. The terminal-independent attributes may include (but are not limited to) applications for the associated ESD protection element, fail-safe/non-fail-safe, powered-off (yes/no), mask levels used, ESD performance and maximum allowed dV/dt (V/sec). The attributes included in the ESD protection element attributes database 324 may also include terminal-dependent attributes for ESD protection components. The terminal dependent attributes may include (but not limited to) Vt1, Vsp, Ron and It2. Additional parameters, such as those noted above, may be included to build an ESD condition model of the ESD protection elements.

The predefined circuits database 326 is configured to store topologies of circuitry wherein each of the topologies has a defined set of attributes for each pair of terminals thereof. The topologies represent the physical and logical structure of circuitry in the IC. The topologies may represent the circuitry as n-terminal "black boxes" having any m components connected between the n terminals in any given fashion. For example, a topology may have two, three, four or more terminals. The terminals may correspond to pins of the IC and can be reference terminals, power terminals, input terminals, etc. The stored topologies represent known circuitry having technology-independent topologies with a defined set of rules for setting global attributes based on the component attributes and for ESD requirements based on topology and ESD cell and path attributes.

The circuit attributes database 328 is configured to store circuitry physical attributes associated with the circuitry topologies. The technology-dependent attributes includes attributes that are assigned to each two-terminal combination of the circuitry topologies. The physical attributes may include (but not limited to): Vt1nobias (i.e., triggering voltage of a parasitic element within the topology under no bias conditions), Vt1 (i.e., triggering voltage of the parasitic element within the topology under specific bias conditions); It1nobias (i.e., triggering current of the parasitic element within the topology under no bias conditions), It1 (i.e., triggering current of the parasitic element within the topology under specific bias conditions); Vsp (i.e., sustaining voltage of the parasitic element within the topology); Ron (i.e., on-resistance of the parasitic element within the topology); It2 (i.e., maximum sustaining current of the parasitic element within the topology); and Wfmax (i.e., maximum effective gate width associated to the parasitic element within the topology). At least some of these parameters may be used to construct an ESD condition model for circuitry of the IC.

Figure 4:
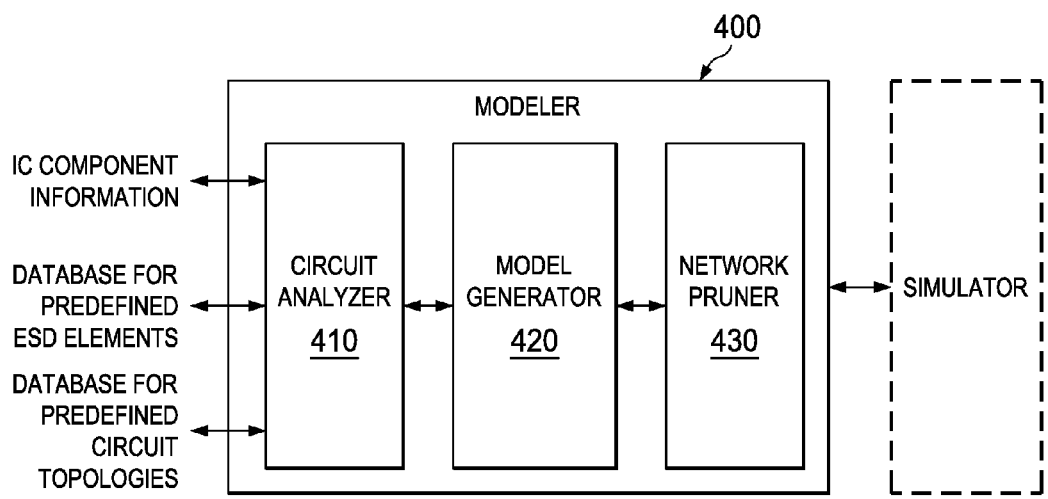
FIG. 4 is a block diagram of an embodiment of an ESD modeler constructed according to the principles of the disclosure.

FIG. 4 is a block diagram of an embodiment of an ESD modeler 400 constructed according to the principles of the disclosure. The modeler 400 includes a circuit analyzer 410, a model generator 420 and a network pruner 430.

The circuit analyzer 410 is configured to provide identified ESD cells and circuitry of the IC by comparing component information of the IC with predefined ESD protection elements and predefined circuit topologies. The component information used by the circuit analyzer 410 may be obtained from a netlist of the IC. The circuit analyzer 410 may employ a pattern matching engine to compare the IC component information with the predefined ESD protection elements and predefined circuit topologies to determine the identified predefined ESD cells and circuitry.

The model generator 420 is configured to create linearized models of the identified ESD cells and the identified circuitry based on physical attributes associated with the identified ESD cells and the identified circuitry. A combination of the linearized models represents operation of the IC component under ESD conditions. A linearized model for the identified ESD cells and the identified circuitry may include a high impedance model and a low impedance model. The high impedance model and the low impedance model are created according to a format for simulating operation of the identified ESD cells and the identified circuitry when under ESD conditions. The model generator 420 may employ the Verilog-A language to generate the models.

The model generator 420 may send the generated high and low impedance models to a simulator. In some embodiments, the simulator may be part of the modeler 400. In other embodiments, the simulator may be an independent device coupled to the modeler 400. Before sending all of the low impedance models to the simulator, the modeler 400 may prune the paths that need simulating using the network pruner 430.

The network pruner 430 is configured to employ the high impedance model to reduce a number of the identified ESD cells and the identified circuitry to simulate employing the low impedance model. The network pruner 430 may employ the high impedance model to calculate a total voltage drop across each path of each pin-pair of the identified ESD cells and the identified circuitry. The voltage drop for each path can be determined based on the total voltage drop of the ESD cells and circuitry in each path. The network pruner 430 may then rank the paths for each pin-pair based on the voltage drop for each of the paths. The paths for each pin-pair may be ranked by voltage drop in increasing order. The model generator 420 may then use the low impedance models to provide models for those paths having the lowest voltage drop for each pin-pair. These paths (the paths having the lowest voltage drop) can then be simulated for each pin-pair. If during simulation, the network pruner 430 determines the voltage drop for the simulated path has a voltage drop greater than the voltage drop of another path of the pin-pair, then the network pruner 430 adds that other path of the pin-pair for modeling and simulating using the low impedance models.

Figure 5:
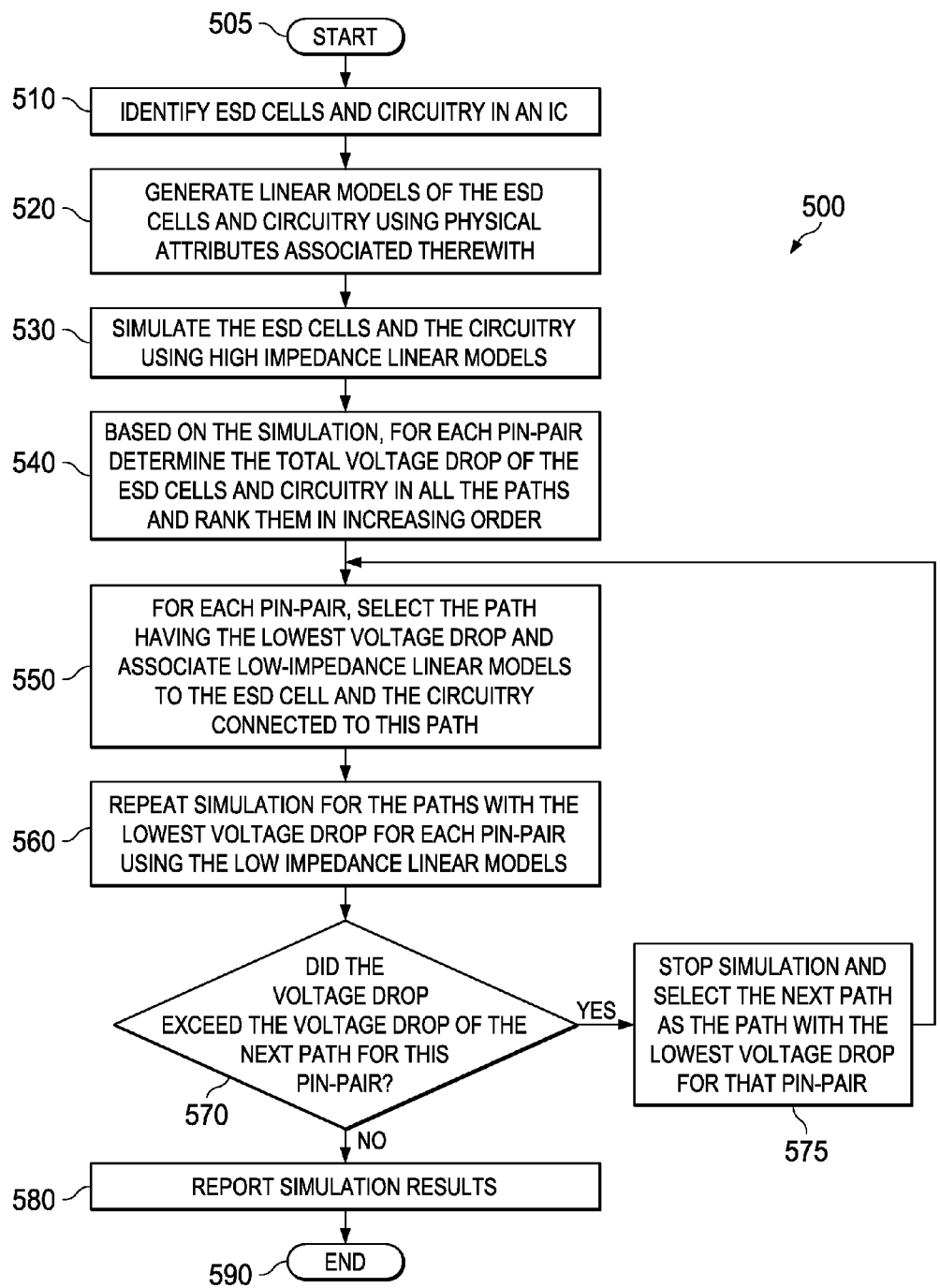
FIG. 5 is a flow diagram of an embodiment of a method of simulating an IC under ESD conditions according to the principles of the disclosure.

FIG. 5 is a flow diagram of an embodiment of a method 500 of simulating an IC under ESD conditions according to the principles of the disclosure. The method 500 may be implemented as a series of computer executable instructions, stored on a computer-readable storage medium, that direct the operation of a processor when executed. In one embodiment, the method 500 may be performed by a dedicated computer specifically programmed for executing the steps thereof. For example, the method 500 or at least part of the method 500, may be performed by a modeler or an ESD simulation system. The method 500 begins in a step 505.

In a step 510, ESD cells and circuitry of an IC are identified. In one embodiment, all of the ESD cells and circuitry of the IC are identified. The ESD cells and the circuitry of the IC may be identified using a pattern matching engine, a predefined ESD protection element database and a database for predefined circuits. The pattern matching engine can compare IC component information to ESD protection elements and circuits of the respective databases to identify ESD cells and circuitry of the IC. The IC component information may be from a netlist, a schematic or layout of the IC. Thus, the pattern matching engine may be configured to compare and match an input string from the IC component information to a group of predefined string patterns representing predefined or known ESD protection elements and circuits.

After identifying the ESD cells and the circuitry of the IC, linear models of the ESD protection cells and circuitry are generated using physical attributes associated therewith in a step 520. The physical attributes may be stored in an ESD protection element attributes database and a circuit attributes database. The linear models may be a low impedance model and a high impedance model that represents the operation of the ESD cells and the circuitry of the IC in an ESD operating area under ESD conditions. An analog modeling language may be used to generate the linear models.

Thereafter, the ESD cells and the circuitry are simulated using high impedance linear models in a step 530. An analog simulator may be used for the simulation. In one embodiment, a SPICE simulator may be used to simulate the ESD cells and the circuitry employing the high impedance linear models.

The total voltage drop in all the paths of each pin-pair of the ESD cells and circuitry are then determined and ordered in a step 540 based on the simulation. The total voltage drop for all the paths may be determined from the simulation results. The paths for each pin-pair may be ranked in increasing order from the lowest voltage drop to the highest voltage drop.

For each pin-pair, a path having the lowest voltage drop is selected in a step 550. A network pruner may order and select the path having the lowest voltage drop based on the simulation results from the high impedance models.

Simulation for those paths of the pin-pairs having the lowest voltage drop is performed employing a low impedance linear model in a step 560. In some embodiments, a low impedance linear model is only used for those paths of a pin-pair that are determined to have the lowest voltage drop. The simulator may again perform the simulations using models generated by the model generator.

A determination is then made in a decisional step 570 if the voltage drop of a simulated path using the low impedance model exceeds the voltage drop of the next ordered path for a pin-pair. The network pruner may be used to make this determination with the simulator. If voltage drop of the selected path does not exceed the voltage drop of the next ordered-path, then the simulation results are reported in a step 580. Electrical signals may be generated to report the results through, for example, a display or a print-out. In some embodiments, the results may be reported to another device in the design flow of the IC. The method 500 then ends in a step 590.

Returning now to step 570, if the voltage drop of the selected path does exceed the voltage drop of the next ordered path, then simulation of the selected path is stopped in a step 575 and the next ordered-path is added to the previous path for that pin-pair. The method 500 then proceeds to step 550 and continues.

The above-described system, apparatus and methods may be embodied in or performed by various conventional digital data processors or computers, wherein the computers are programmed or store executable programs of sequences of software instructions to perform one or more of the steps of the methods, e.g., steps of the method of FIG. 5. The software instructions of such programs may be encoded in machine-executable form on conventional digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods, e.g., one or more of the steps of the method of FIG. 5. Additionally, a dedicated apparatus or system, such as, a modeler or and ESD simulation system, may be designed to include the necessary circuitry to perform each step of the method of FIG. 5.

Those skilled in the art to which this application relates will appreciate that other and further additions, deletions, substitutions and modifications may be made to the described embodiments.

What is claimed is:

1. A method of simulating an integrated circuit under electrostatic discharge (ESD) conditions implemented by executing a series of computer executable instructions that direct the operation of a computer to perform the following steps:
   identifying ESD protection cells and circuitry of the integrated circuit using a pattern matching engine that compares an input string representing component information provided for the integrated circuit against stored predefined string patterns representing known ESD protection elements and circuits;
   generating linear models of the identified ESD protection cells and circuitry using stored predefined physical attributes associated with the known ESD protection elements and circuits corresponding to the identified cells and circuitry; the linear models being respective low impedance and high impedance models representing the operation of the identified cells and circuitry in an ESD operating area under ESD conditions;
   simulating the identified ESD protection cells and circuitry using the high impedance models generated for those cells and circuits;
   determining a total voltage drop in all paths of each pin-pair of the ESD cells and circuitry based on results of the high impedance model simulation, ranking paths for each pin-pair in order of voltage drop, and selecting for each pin-pair a path having the lowest voltage drop;
   simulating the identified ESD protection cells and circuitry using the low impedance models applied for those paths of the pin-pairs having the selected lowest voltage drops;
   determining whether the voltage drop of a simulated path using the low impedance model exceeds the voltage drop of the next ordered path for a pin-pair;
   if the voltage drop of the selected path does not exceed the voltage drop of the next ordered path, reporting the simulation results; and
   if the voltage drop of the selected path does exceed the voltage drop of the next ordered path, stopping the simulation using the selected path, and repeating the generating, high impedance model simulating, voltage drop determining, low impedance model simulating and exceed determining steps using the next ordered path for that pin-pair.

2. The method of claim 1, wherein the component information provided for the integrated circuit is provided from a netlist, a schematic or a layout of the integrated circuit.

3. The method of claim 2, wherein simulating the identified ESD protection cells and circuitry using high impedance models is done using an analog simulator.

4. The method of claim 2, wherein simulating the identified ESD protection cells and circuitry using high impedance models is done using a SPICE simulator.

5. The method of claim 2, wherein the paths for each pin-pair are ranked in order from the lowest voltage drop to a highest voltage drop.

6. The method of claim 5, wherein the paths are ordered and selected by a network pruner.

7. The method of claim 6, wherein the network pruner is used to determine whether the voltage drop of a simulated path using the low impedance model exceeds the voltage drop of the next ordered path for a pin-pair.

8. The method of claim 7, wherein the simulation results are reported using a display or a print-out.

9. The method of claim 7, wherein the simulation results are reported to another device in a design flow for the integrated circuit.

10. The method of claim 1, wherein simulating the identified ESD protection cells and circuitry using high impedance models is done using an analog simulator.

11. The method of claim 1, wherein simulating the identified ESD protection cells and circuitry using high impedance models is done using a SPICE simulator.

12. The method of claim 1, wherein the paths for each pin-pair are ranked in order from the lowest voltage drop to a highest voltage drop.

13. The method of claim 1, wherein the paths are ordered and selected by a network pruner.

14. The method of claim 1, wherein a network pruner is used to determine whether the voltage drop of a simulated path using the low impedance model exceeds the voltage drop of the next ordered path for a pin-pair.

15. The method of claim 1, wherein the simulation results are reported using a display or a print-out.

16. The method of claim 1, wherein the simulation results are reported to another device in a design flow for the integrated circuit.

* * * * *